United States Patent
Colinge et al.

(10) Patent No.: US 9,419,098 B2
(45) Date of Patent: Aug. 16, 2016

(54) TUNING STRAIN IN SEMICONDUCTOR DEVICES

(71) Applicant: Taiwan Semiconductor Manufacturing Company, Ltd., Hsin-Chu (TW)

(72) Inventors: Jean-Pierre Colinge, Hsin-Chu (TW); Kuo-Cheng Ching, Zhubei (TW); Gwan Sin Chang, Hsin-Chu (TW); Zhiqiang Wu, Chubei (TW); Chih-Hao Wang, Baoshan Township (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/677,612

(22) Filed: Apr. 2, 2015

(65) Prior Publication Data
US 2015/0214333 A1    Jul. 30, 2015

Related U.S. Application Data

(62) Division of application No. 13/906,146, filed on May 30, 2013, now Pat. No. 9,006,842.

(51) Int. Cl.
*H01L 29/66* (2006.01)
*H01L 29/78* (2006.01)
(Continued)

(52) U.S. Cl.
CPC .... *H01L 29/66545* (2013.01); *H01L 21/02142* (2013.01); *H01L 21/02164* (2013.01); *H01L 21/02236* (2013.01); *H01L 21/02532* (2013.01);
(Continued)

(58) Field of Classification Search
CPC ............... H01L 29/66545; H01L 29/6681; H01L 29/785
See application file for complete search history.

(56) References Cited

U.S. PATENT DOCUMENTS

| 6,359,311 B1 | 3/2002 | Colinge et al. |
| 7,109,516 B2 | 9/2006 | Langdo et al. |

(Continued)

FOREIGN PATENT DOCUMENTS

| DE | 112006000241 | 1/2010 |
| DE | 102013103057 | 10/2013 |

(Continued)

OTHER PUBLICATIONS

Bangsaruntip, G.M. et al., "High Performance and Highly Uniform Gate-All-Around Silicon Nanowire MOSFETs with Wire Size Dependent Scaling," 4 pages, Dec. 7-9, 2009.

(Continued)

*Primary Examiner* — Peniel M Gumedzoe
*Assistant Examiner* — Christopher Johnson
(74) *Attorney, Agent, or Firm* — Slater Matsil, LLP

(57) ABSTRACT

A Fin Field-Effect Transistor (FinFET) includes a semiconductor layer over a substrate, wherein the semiconductor layer forms a channel of the FinFET. A first silicon germanium oxide layer is over the substrate, wherein the first silicon germanium oxide layer has a first germanium percentage. A second silicon germanium oxide layer is over the first silicon germanium oxide layer. The second silicon germanium oxide layer has a second germanium percentage greater than the first germanium percentage. A gate dielectric is on sidewalls and a top surface of the semiconductor layer. A gate electrode is over the gate dielectric.

20 Claims, 16 Drawing Sheets

(51) Int. Cl.
*H01L 29/775* (2006.01)
*H01L 21/02* (2006.01)
*H01L 21/306* (2006.01)
*H01L 21/324* (2006.01)
*H01L 29/165* (2006.01)

(52) U.S. Cl.
CPC ........ *H01L 21/30604* (2013.01); *H01L 21/324* (2013.01); *H01L 29/165* (2013.01); *H01L 29/66439* (2013.01); *H01L 29/66795* (2013.01); *H01L 29/775* (2013.01); *H01L 29/785* (2013.01); *H01L 29/7843* (2013.01); *H01L 29/7849* (2013.01)

(56) References Cited

U.S. PATENT DOCUMENTS

| | | | |
|---|---|---|---|
| 7,241,653 | B2 | 7/2007 | Hareland et al. |
| 7,259,425 | B2 | 8/2007 | An et al. |
| 7,456,476 | B2 | 11/2008 | Hareland et al. |
| 7,508,031 | B2 | 3/2009 | Liu et al. |
| 7,820,513 | B2 | 10/2010 | Hareland et al. |
| 7,898,041 | B2 | 3/2011 | Radosavljevic et al. |
| 8,067,818 | B2 | 11/2011 | Shah et al. |
| 8,242,568 | B2 | 8/2012 | Ikeda et al. |
| 8,273,626 | B2 | 9/2012 | Hareland et al. |
| 8,405,164 | B2 | 3/2013 | Hareland et al. |
| 8,466,490 | B2 | 6/2013 | Liu et al. |
| 8,815,712 | B2 | 8/2014 | Wan et al. |
| 8,823,059 | B2 | 9/2014 | Dewey et al. |
| 8,969,179 | B2 | 3/2015 | Gotsmann et al. |
| 2004/0108523 | A1 | 6/2004 | Chen et al. |
| 2004/0108559 | A1 | 6/2004 | Sugii et al. |
| 2004/0166642 | A1 | 8/2004 | Chen et al. |
| 2005/0121706 | A1 | 6/2005 | Chen et al. |
| 2005/0127466 | A1 | 6/2005 | Furukawa et al. |
| 2006/0172497 | A1 | 8/2006 | Hareland et al. |
| 2006/0189043 | A1 | 8/2006 | Schulz |
| 2006/0240622 | A1 | 10/2006 | Lee et al. |
| 2007/0120156 | A1 | 5/2007 | Liu et al. |
| 2007/0221956 | A1 | 9/2007 | Inaba |
| 2007/0241414 | A1 | 10/2007 | Narihiro |
| 2008/0017934 | A1 | 1/2008 | Kim et al. |
| 2008/0258207 | A1 | 10/2008 | Radosavljevic et al. |
| 2009/0008705 | A1 | 1/2009 | Zhu et al. |
| 2009/0061572 | A1 | 3/2009 | Hareland et al. |
| 2010/0059807 | A1* | 3/2010 | Cho ............. H01L 27/10814 257/306 |
| 2010/0193770 | A1 | 8/2010 | Bangsaruntip et al. |
| 2010/0252801 | A1 | 10/2010 | Sekaric et al. |
| 2013/0228751 | A1 | 9/2013 | Gotsmann et al. |
| 2013/0270512 | A1 | 10/2013 | Radosavljevic et al. |
| 2013/0270652 | A1 | 10/2013 | Liaw |
| 2013/0285141 | A1 | 10/2013 | Kuo et al. |
| 2014/0001441 | A1 | 1/2014 | Kim et al. |
| 2014/0054724 | A1 | 2/2014 | Ching et al. |
| 2014/0175561 | A1 | 6/2014 | Colinge et al. |
| 2014/0183643 | A1 | 7/2014 | Colinge et al. |
| 2014/0197456 | A1 | 7/2014 | Wang et al. |
| 2014/0203334 | A1 | 7/2014 | Colinge et al. |
| 2014/0273363 | A1 | 9/2014 | Chiu et al. |
| 2014/0332852 | A1 | 11/2014 | Dewey |
| 2015/0008489 | A1 | 1/2015 | Ching et al. |
| 2015/0021697 | A1 | 1/2015 | Colinge et al. |

FOREIGN PATENT DOCUMENTS

| | | |
|---|---|---|
| JP | 2007258485 | 10/2007 |
| JP | 2011151272 | 8/2011 |
| KR | 1020130076680 | 7/2013 |
| KR | 1020130120973 | 11/2013 |

OTHER PUBLICATIONS

Bernard, Emilie et al., "First Internal Spacers' Introduction in Record High ION/IOFF TiN/HfO2 Gate Multichannel MOSFET Satisfying Both High Performance and Low Standby Power Requirements," IEEE Electron Device Letters, vol. 30, No. 2, pp. 148-151, Feb. 2009.
Blacic, James D. et al., "Plasticity and Hydrolytic Weakening of Quartz Single Crystals," Journal of Geophysical Research, vol. 89, No. B6, pp. 4223-4239, Jun. 10, 1984.
Dana et al., "Raman and TEM studies of Ge nanocrystal formation in SiOx:Ge/SiOx multilayers", Phys. Status Solidi C 4, 288 (2007). http://dx.doi.org/10.1002/pssc.200673233.
Ferain, Isabelle et al., "Multigate transistors as the future of classical metal-oxide-semiconductor field-effect transistors," Nature, vol. 479, pp. 2-8, Nov. 17, 2011.
Han, Jin-Woo et al., "Gate-All-Around Silicon Nanowire MOSFETs on Bulk Substrate," FB4-4, pp. 648-649, Feb. 19-20, 2009.
Kuhn, Kelin J. "Considerations for Ultimate CMOS Scaling," IEEE Transactions on Electron Devices, vol. 59, No. 7, 1813-1828, Jul. 2012.
Monfray, S. et al., "50nm—Gate All Around (GAA)—Silicon on Nothing (SON)—Devices: A Simple Way to Co-integration of GAA Transistors within bulk MOSFET process," IEEE Symposium on VLSI Technology Digest of Technical Papers, 2 pages, Jun. 11-13, 2002.
Ojovan, M.I. et al., "Topologically disordered systems at the glass transition," White Rose Research Online, White Rose university consortium, Universities of Leeds, Sheffield & York, http://eprints.whiterose.ac.uk/1958, Journal of Physics: Condensed Matter, 18 (50), pp. 11507-11520. Dec. 2006.
Yeo, Kyoung et al., "Gate-All-Around (GAA) Twin Silicon Nanowire MOSFET (TSNWFET) with 15 nm Length Gate and 4 nm Radius Nanowires," 4 pages, Dec. 11-13, 2006.
Moon, Dong-II et al., "Silicon Nanowire All-Around Gate MOSFETs Built on a Bulk Substrate by All Plasma-Etching Routes" IEEE Electron Device Letters, vol. 32, No. 4, Apr. 2011.

* cited by examiner

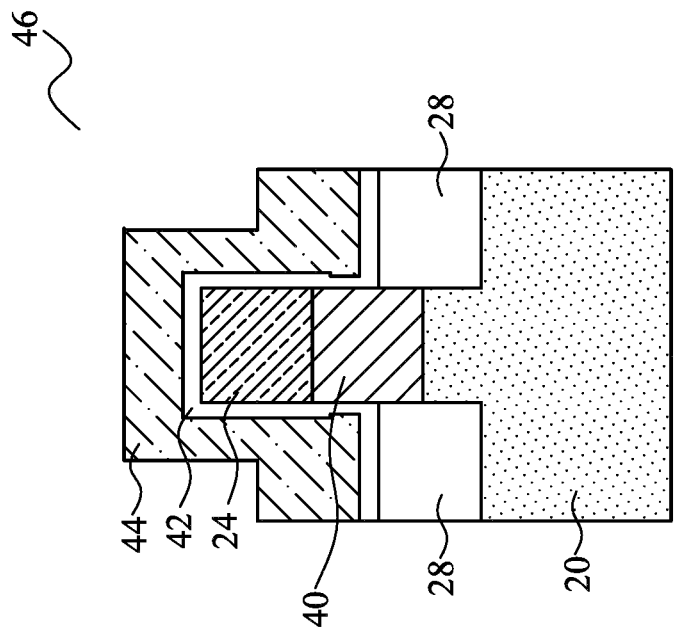
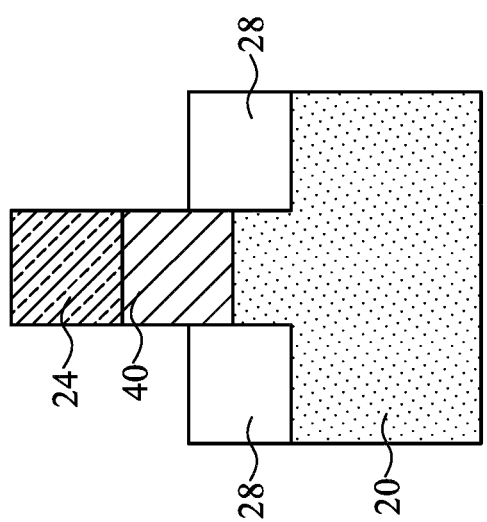
Fig. 2C
Fig. 2B

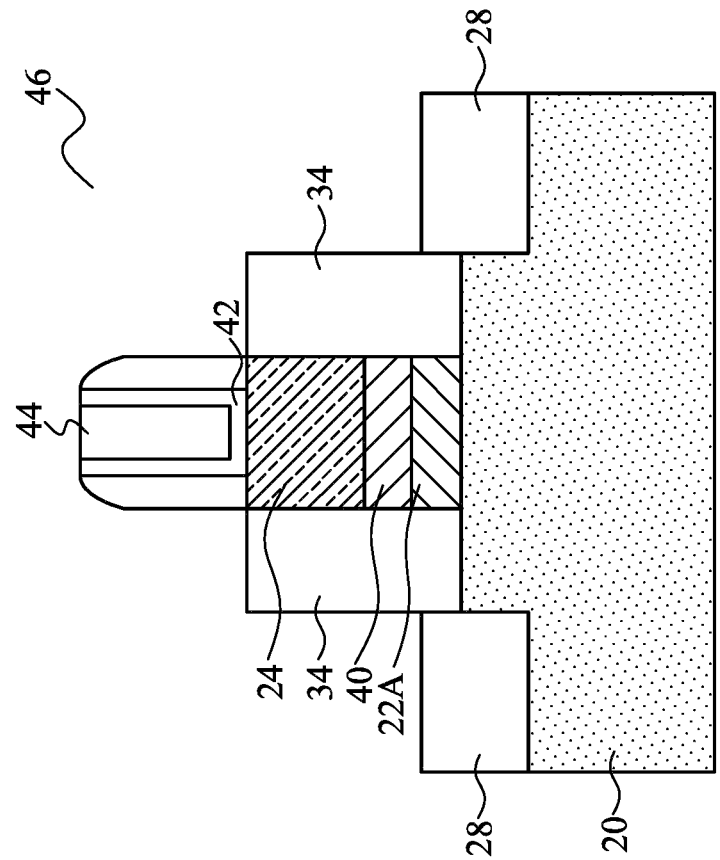
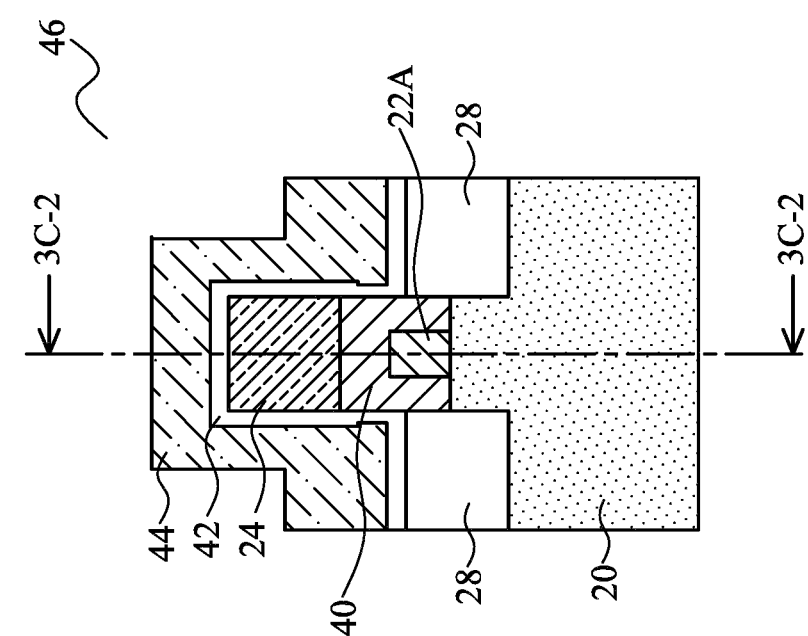
Fig. 3C-1
Fig. 3C-2

US 9,419,098 B2

TUNING STRAIN IN SEMICONDUCTOR DEVICES

PRIORITY CLAIM AND CROSS-REFERENCE

This application is a divisional of U.S. patent application Ser. No. 13/906,146, entitled "Tuning Strain in Semiconductor Devices," filed on May 30, 2013, which application is incorporated herein by reference.

BACKGROUND

The reduction in the size and the inherent features of semiconductor devices (e.g., a Metal-Oxide-Semiconductor (MOS) device) has enabled continued improvement in speed, performance, density, and cost per unit function of integrated circuits over the past few decades.

To enhance the performance of MOS device, stress may be introduced into the channel region of a MOS transistor to improve carrier mobility. Generally, it is desirable to induce a tensile stress in the channel region of an N-type Metal-Oxide-Semiconductor (NMOS) device in a source-to-drain direction, and to induce a compressive stress in the channel region of a P-type Metal-Oxide-Semiconductor (PMOS) device in a source-to-drain direction.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 1I are cross-sectional views and perspective views of intermediate stages in the manufacturing of a Fin Field-Effect Transistor (FinFET) in accordance with some exemplary embodiments;

FIGS. 2A through 2C illustrate cross-sectional views of intermediate stages in the manufacturing of a FinFET in accordance with some alternative exemplary embodiments;

FIGS. 3A through 3C-2 illustrate cross-sectional views of intermediate stages in the manufacturing of a FinFET in accordance with yet alternative exemplary embodiments;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Fin Field-Effect Transistors (FinFETs) and methods of forming the same are provided in accordance with various exemplary embodiments. The intermediate stages of forming the FinFETs in accordance with some embodiments are illustrated. The variations of the embodiments are discussed. Throughout the various views and illustrative embodiments, like reference numbers are used to designate like elements.

Figure 1A:
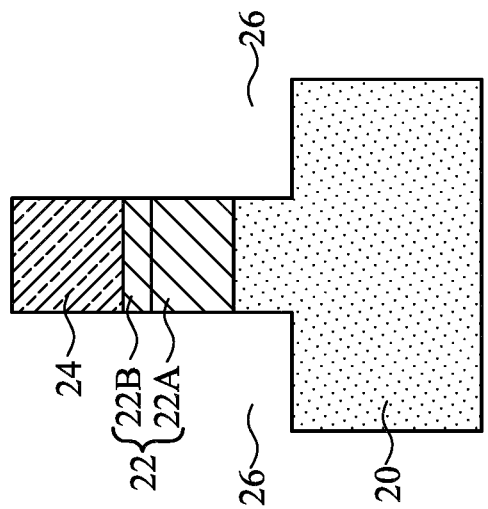

FIGS. 1A through 1I are cross-sectional views and perspective views of intermediate stages in the manufacturing of a FinFET in accordance with some exemplary embodiments. FIG. 1A illustrates a cross-sectional view of substrate 20, which may be a part of a wafer. Substrate 20 may be a semiconductor substrate, which may further be a silicon substrate, a silicon carbon substrate, a silicon-on-insulator substrate or a substrate formed of other semiconductor materials. Substrate 20 may be lightly doped with a p-type or an n-type impurity.

Silicon germanium (SiGe) layer 22 is formed over substrate 20 through epitaxy. Accordingly, SiGe layer 22 forms a crystalline layer. In some embodiments, the germanium percentage (atomic percentage) of SiGe layer 22 is between about 10 percent and about 50 percent. It is appreciated, however, that the values recited throughout the description are merely examples, and may be changed to different values.

In accordance with some embodiments, SiGe layer 22 is a gradient layer including at least a lower layer (portion) 22A having a first germanium percentage, and an upper layer (portion) 22B having a second germanium percentage higher than the first germanium percentage. In some embodiments, the first germanium percentage of SiGe layer 22A is between about 10 percent and about 30 percent, and the second germanium percentage of SiGe layer 22B is between about 30 percent and about 60 percent. Furthermore, a difference between the second germanium percentage and the first germanium percentage may be greater than about 10 percent, 20 percent, 50 percent, or higher.

Figure 5:
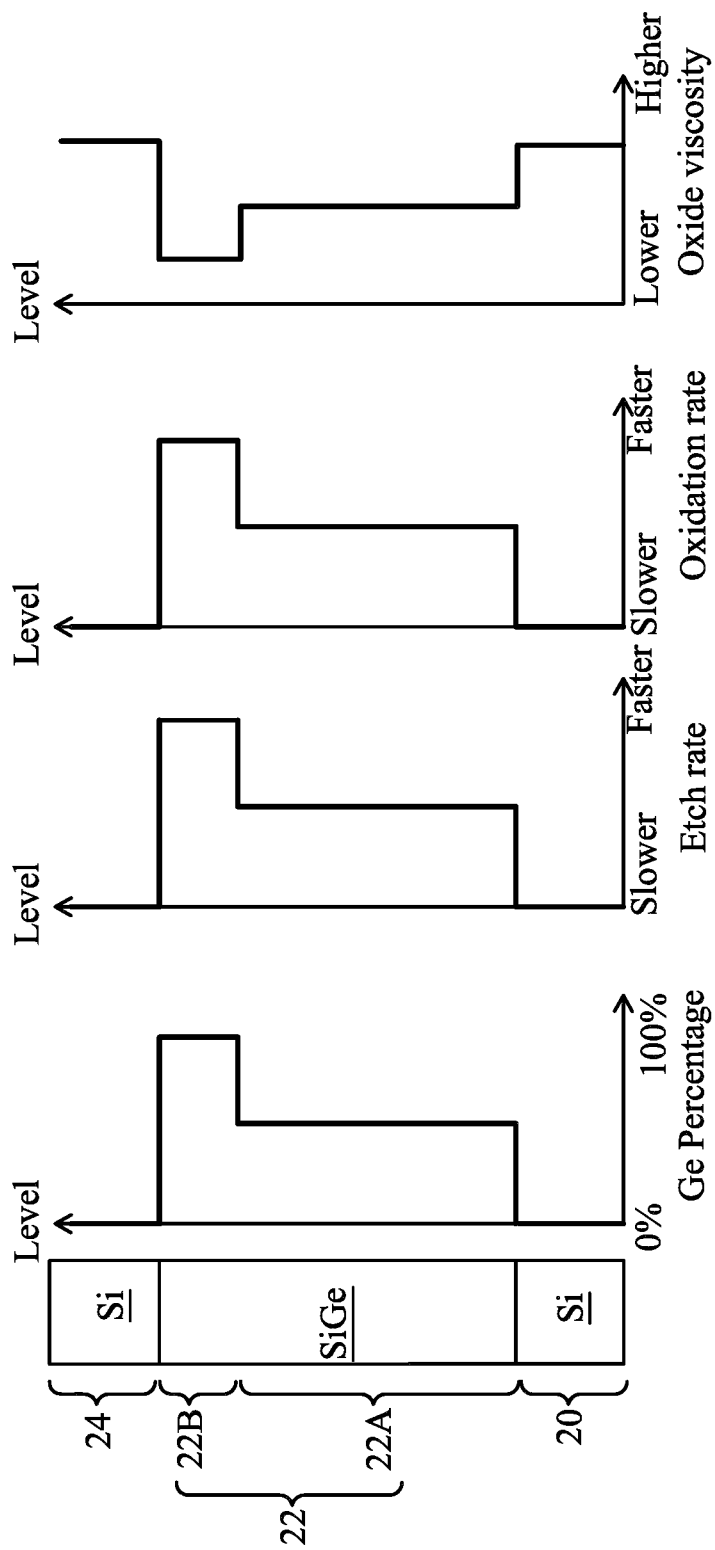
FIG. 5 illustrates the percentage profile of SiGe layers and the respective etch rate profile, oxidation rate profile, and oxide viscosity profile in accordance with some embodiments.

FIG. 5 schematically illustrates the cross-sectional view of layers 20, 22 and 24, and the corresponding germanium percentage profile (the first graph), etch rate profile (the second graph), oxidation rate profile (the third graph), and oxide viscosity profile (the fourth graph). In each profile, the Y axis (the level) represents the height measured starting from a point in substrate 20. In the illustrated exemplary embodiments, as shown in the first graph, SiGe layer 22B has a substantially uniform germanium percentage that is greater than the substantially uniform germanium percentage of SiGe layer 22A. The change in the germanium percentage affects other characteristics of SiGe layer 22. As shown in the second graph in FIG. 5, the etch rate of SiGe layer 22 is affected by the percentage profile. Using appropriate etchant, such as HCl, HF, HF—HNO$_3$, HF:H$_2$O$_2$:CH$_3$COOH-based solutions, halogen-gas-based plasmas, gaseous acid vapors such as HCl or HF vapor, or the like, the portions (such as 22B) of SiGe layer 22 having higher germanium percentages will have higher etch rates than the portions (such as 22A) of SiGe layer 22 having lower germanium percentages, as shown in the second graph of FIG. 5. The etch rates are illustrated as relative values.

Furthermore, as shown in the third graph of FIG. 5, the portions (such as 22B) of SiGe layer 22 having higher germanium percentages have higher oxidation rates than the portions (such as 22A) of SiGe layer 22 having lower germanium percentages. The oxidation rates are illustrated as relative values.

In addition, as shown in the fourth graph of FIG. 5, the portions (such as 22B) of SiGe layer 22 having higher germanium percentages have lower viscosities or lower softening temperatures than the portions (such as 22A) of SiGe layer 22 having lower germanium percentages. The viscosity values are illustrated as relative values, and are represented by temperatures (referred to as softening temperature hereinafter). The softening temperature of a region (such as a SiGe layer) is the temperature above which the respective SiGe layer becomes softened (and at least partially liquidized). A higher softening temperature means that the respective oxide needs a higher temperature to be softened, and vice versa. Annealed at a high temperature, the oxide with a lower softening temperature becomes softer than an oxide with a higher softening temperature. Accordingly, when increasing the temperature during the annealing of SiGe layer 22, SiGe layer 22B that has the higher germanium percentage is softened first, while SiGe layer 22A that that has a lower germanium percentage is not softened yet. When the temperature further increases, SiGe layer 22A is also softened, and SiGe layer 22B is softened more.

Figure 6:
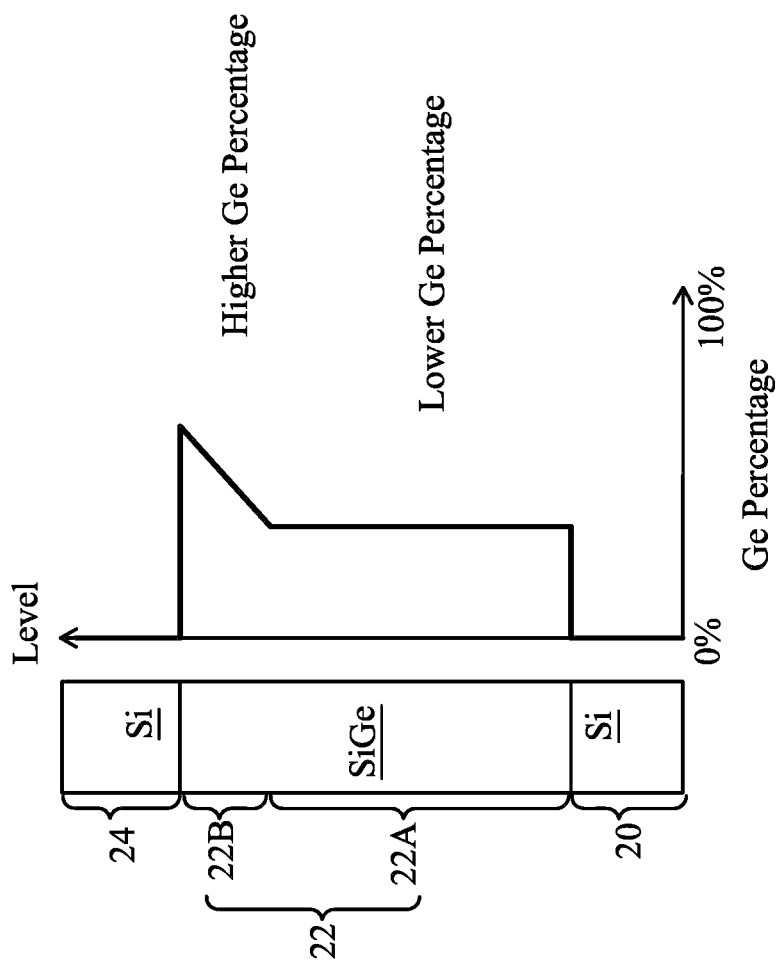
FIGS. 6 through 8 illustrate the percentages of germanium in various embodiments.
Figure 7:
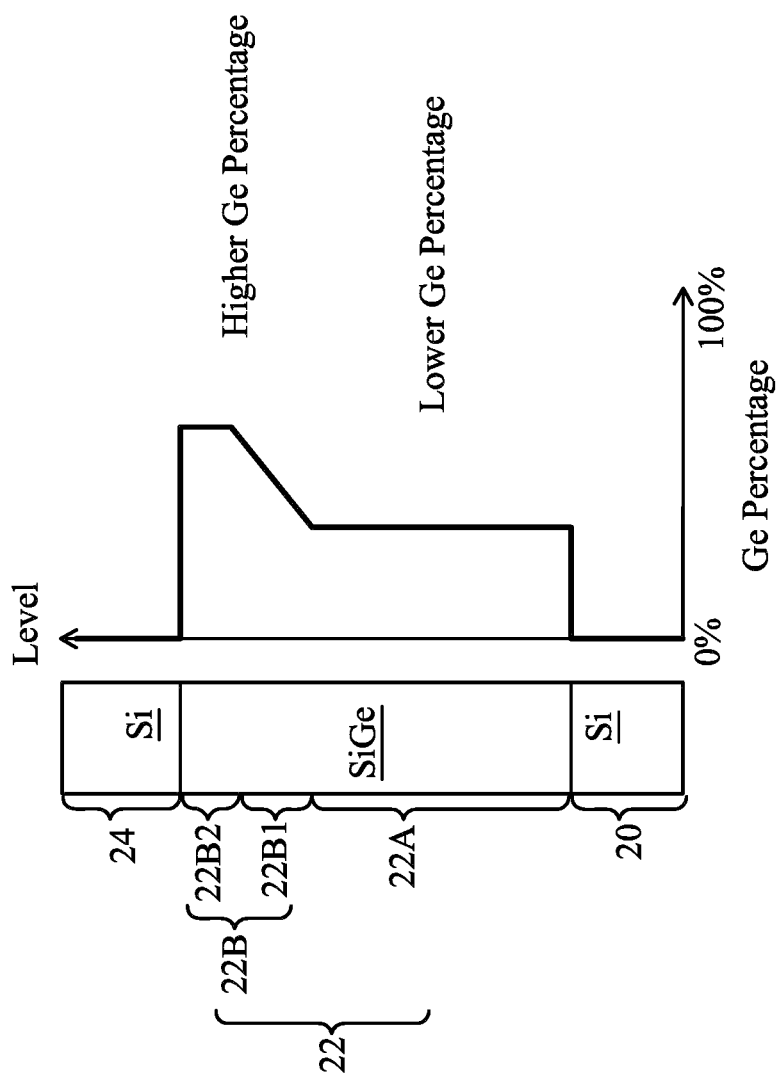
Figure 8:
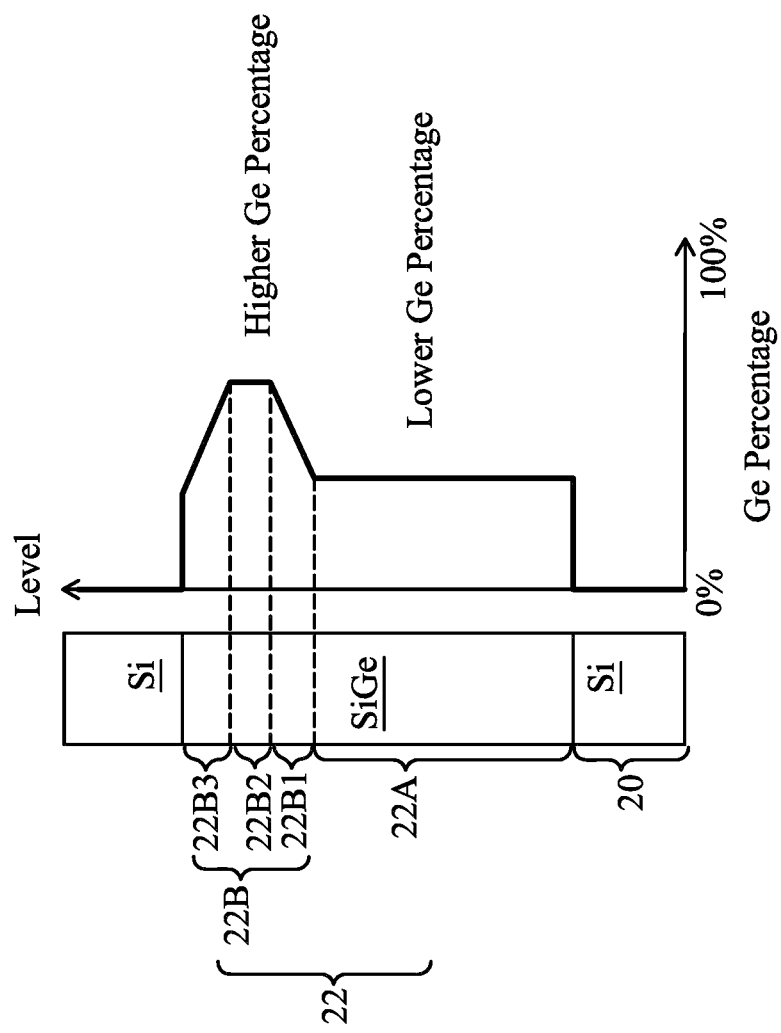

FIGS. 6, 7, and 8 illustrate some exemplary germanium percentage profiles of SiGe layers 22A and 22B (FIG. 1A). In each of FIGS. 6, 7, and 8, the germanium percentage of SiGe layer 22B is higher than the germanium percentage of SiGe layer 22A. In FIG. 6, SiGe layer 22A has a uniform germanium percentage, and SiGe layer 22B has gradually and continuously increased germanium percentages. In FIG. 7, SiGe layer 22B includes layer 22B1 and layer 22B2 over layer 22B1, wherein layer 22B 1 has gradually and continuously increased germanium percentages, and layer 22B2 has a uniform germanium percentage. In FIG. 8, SiGe layer 22B includes layer 22B1, layer 22B2 over layer 22B1, and layer 22B3 over layer 22B2. Layer 22B1 has gradually increased germanium percentages. Layer 22B2 has a uniform germanium percentage, and layer 22B3 has a gradually reduced germanium percentages.

Referring again to FIG. 1A, silicon layer 24 is formed over SiGe layer 22 through epitaxy. In some embodiments, silicon layer 24 is free from germanium, or is a substantially pure silicon layer that is substantially free from germanium, for example, with a germanium percentage lower than about 1 percent. Silicon layer 24 may be doped with p-type or n-type impurities such as boron, arsenic, or the like.

Figure 1B:
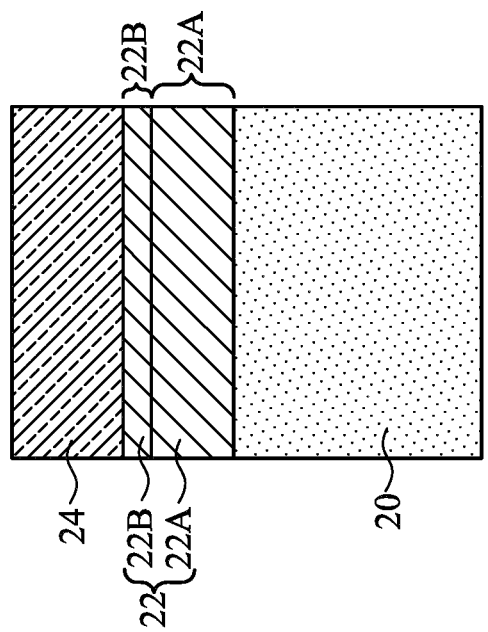

Referring to FIG. 1B, an etch step is performed to etch silicon layer 24, SiGe layer 22, and substrate 20, forming trenches 26. The etch may be performed using a dry etch step adopting an anisotropic etching method, so that the sidewalls of trenches 26 are substantially vertical.

Figures 1, 1C, 2:
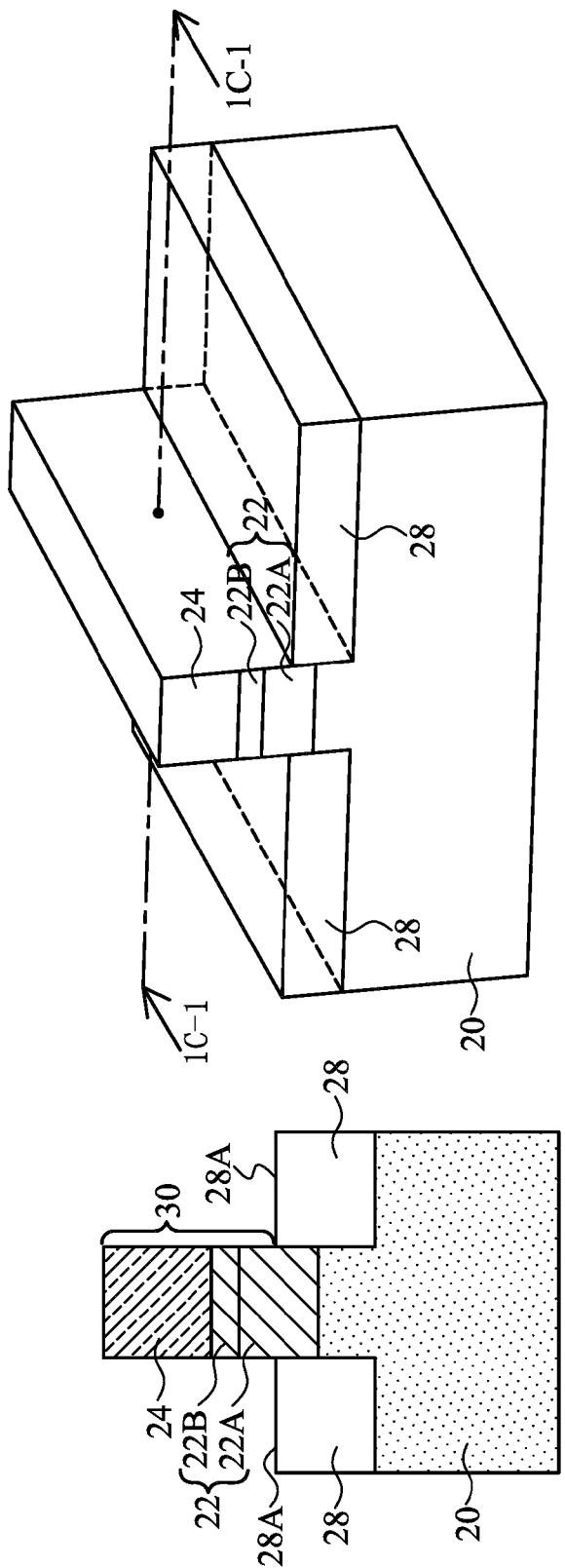

Next, as shown in FIG. 1C-1, isolation regions 28, which may be Shallow Trench Isolation (STI) regions, are formed in trenches 26 (FIG. 1B). The formation may include filling trenches 26 with a dielectric layer(s), and performing a Chemical Mechanical Polish (CMP) to level the top surface of the dielectric material with the top surface of silicon layer 24. STI regions 28 are then recessed. The top surface 28A of the resulting STI regions 28 may be lower than the top surface of SiGe layer 22. Top surface 28A may be higher than, level with, or lower than, the bottom surface of SiGe layer 22 in some embodiments. Throughout the description, the portions of silicon layer 24 and SiGe layer 22 over top surface 28A of STI regions 28 are referred to as fin 30 hereinafter.

FIG. 1C-2 illustrates a perspective view of the structure in FIG. 1C-1, wherein the cross-sectional view in FIG. 1C-1 is obtained from the plane containing line 1C-1-1C-1 in FIG. 1C-2.

Figures 1, 1D:
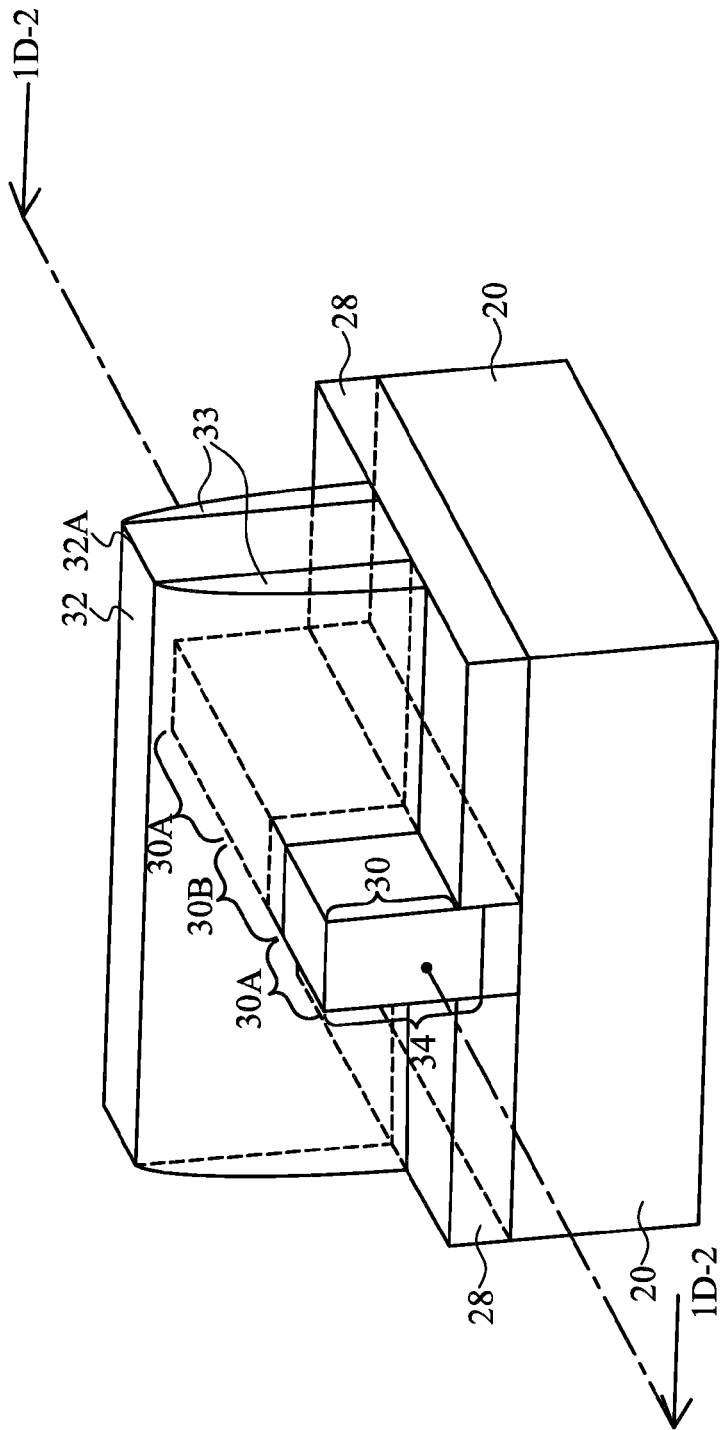
Figures 1, 1D, 2:
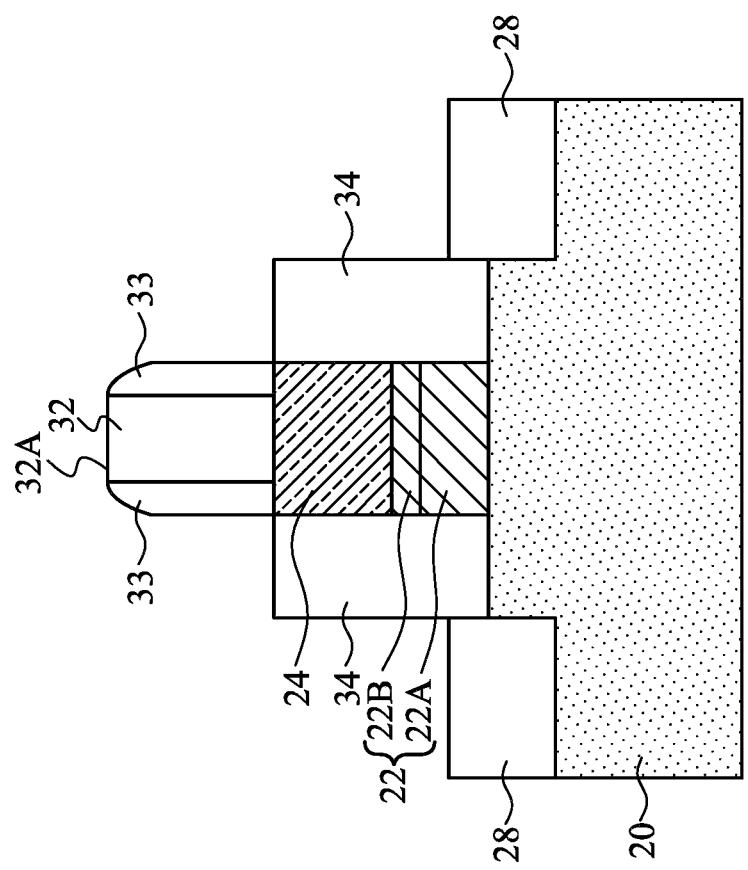

Referring to FIGS. 1D-1 and 1D-2, which are a perspective view and a cross-sectional view, respectively, dummy gate 32 and spacers 33 are formed. Dummy gate 32 may be formed of, for example, polysilicon, although other materials may also be used. In some embodiments, dummy gate 32 has a composite structure comprising a plurality of layers, and may include, for example, a silicon nitride layer and/or a silicon oxide layer as a bottom layer (not shown), and a top layer (not shown) over the bottom layer, wherein the top layer may be a polysilicon layer, for example. Dummy gate 32 has top surface 32A higher than the top surface of semiconductor fin 30. The formation of dummy gate 32 may include forming blanket dummy gate layer(s), performing a CMP to level the top surface of the blanket dummy gate layer(s), and patterning the blanket dummy gate layers. The remaining portion of the blank layers(s) is dummy gate 32. Dummy gate 32 covers middle portion 30B of semiconductor fin 30, and opposite end portions 30A of semiconductor fin 30 are not covered. Dummy gate 32 may also have a lengthwise direction substantially perpendicular to the lengthwise direction of semiconductor fin 30. Spacers 33 are formed on the sidewalls of dummy gate 32 in some embodiments.

FIG. 1D-2 illustrates a cross-sectional view of the structure in FIG. 1D-1, wherein the cross-sectional view is obtained from the plane containing line 1D-2-1D-2 in FIG. 1D-1. In some embodiments, after the formation of dummy gate 32 and spacers 33, the exposed portions of fin 32 are etched to form recesses, followed by an epitaxy to grow a semiconductor material in the recess to form epitaxy regions 34. In some embodiments, epitaxy regions 34 comprise silicon, silicon phosphorous, or the like, and are doped heavily with n-type impurities such as phosphorous. An implantation may also be performed to dope the exposed portion (in fin portions 30A) of silicon layer 24 to form source and drain regions 34 (referred to as source/drain regions hereinafter), which may have an n-type impurity concentration between about $1E19/cm^3$ and about $1E21/cm^3$. Although FIG. 1D-1 shows that the sidewalls of source/drain 34 are straight, they may also be slanted. For example, source/drain 34 may also have a spade-shape in a cross-sectional view. A portion of the original fin material outside of the gate and gate spacer structure can be removed prior to the epitaxy step.

Figure 1E:
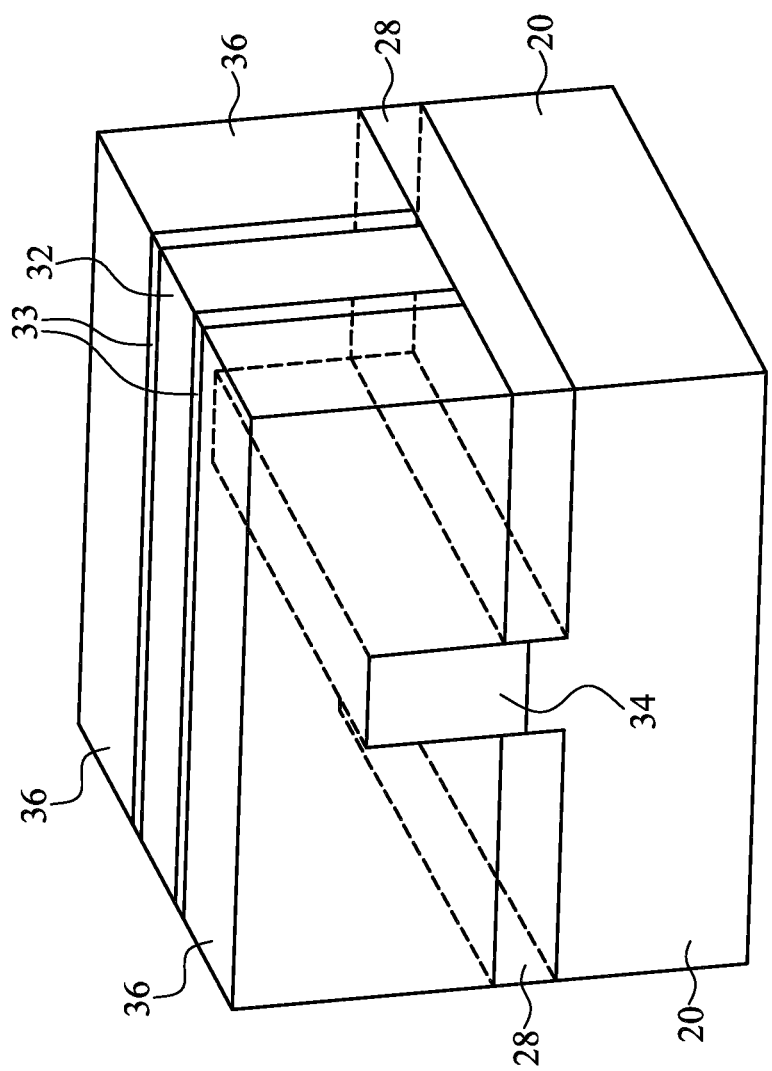

FIG. 1E illustrates a perspective view of the structure after the formation of Inter-Layer Dielectric (ILD) 36. ILD 36 is formed of a dielectric material such as Phospho-Silicate Glass (PSG), Boro-Silicate Glass (BSG), Boron-Doped Phospho-Silicate Glass (BPSG), or the like. A CMP may be performed to level the top surface of ILD 36 with the top surface of dummy gate 32. Accordingly, source/drain regions 34 are buried under ILD 36.

Figure 1F:
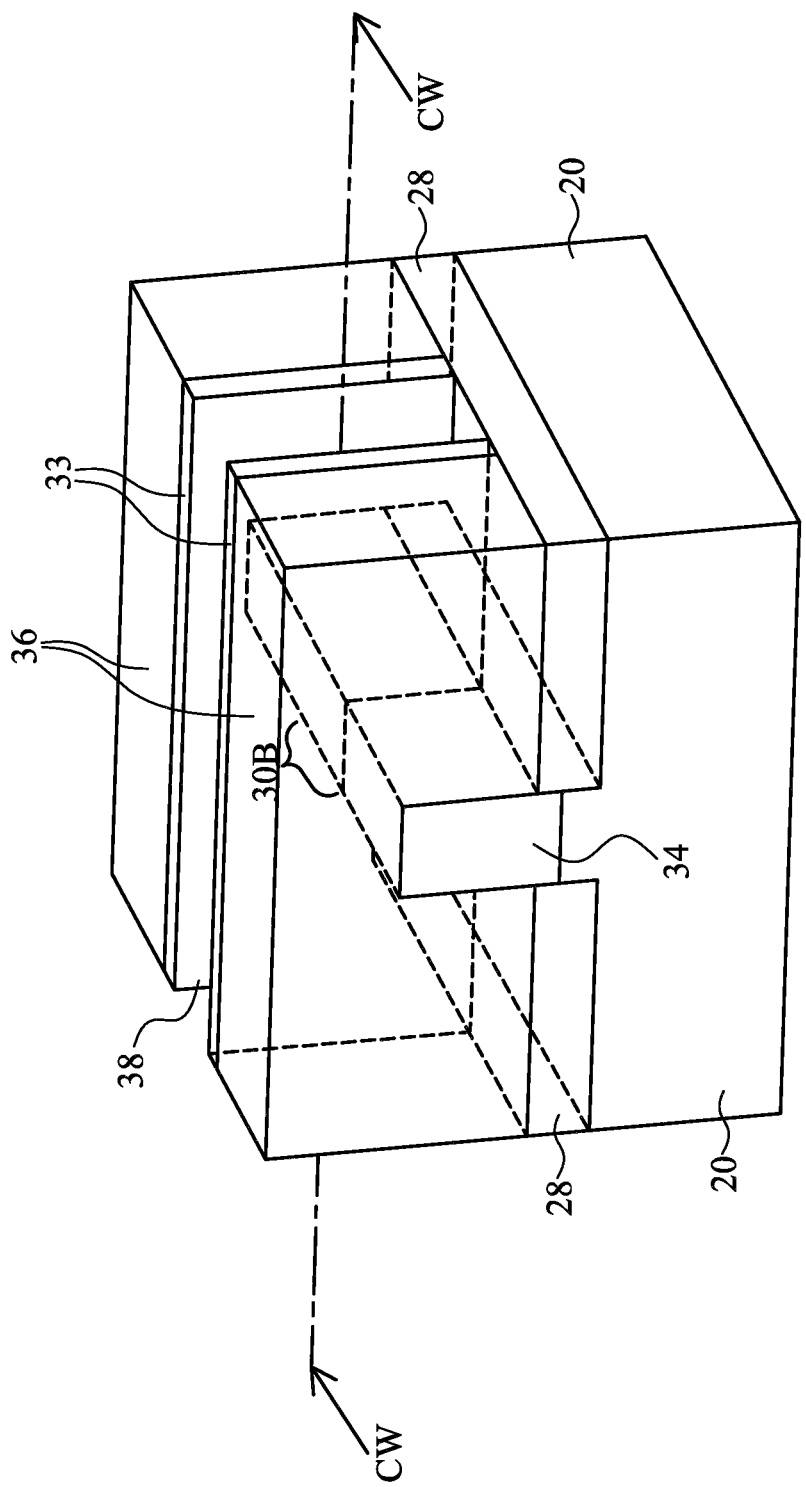

Next, dummy gate 32 is removed in an etching step, so that recess 38 is formed in ILD 36, as shown in FIG. 1F. The middle portion 30B of semiconductor fin 30 is exposed to recess 38. In the embodiments wherein dummy gate 32 is a composite gate, the bottom layer (such as a silicon nitride layer) of dummy gate 32 may be used as an etch stop layer when the top layer (such as a polysilicon layer) of dummy gate 32 is etched. The bottom layer of dummy gate 32 may be removed after the removal of the top layer of dummy gate 32.

Figure 1H:
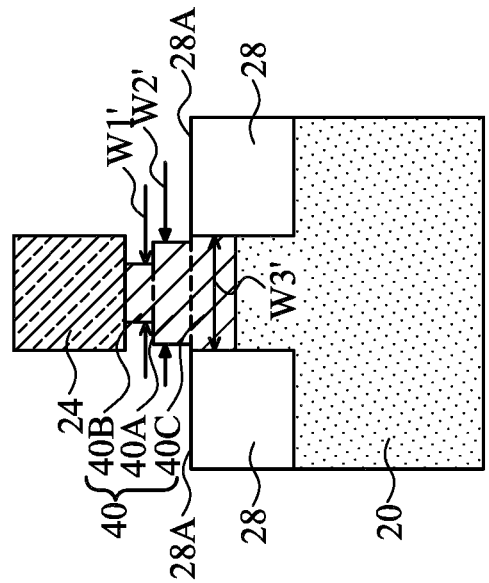
Figure 1G:
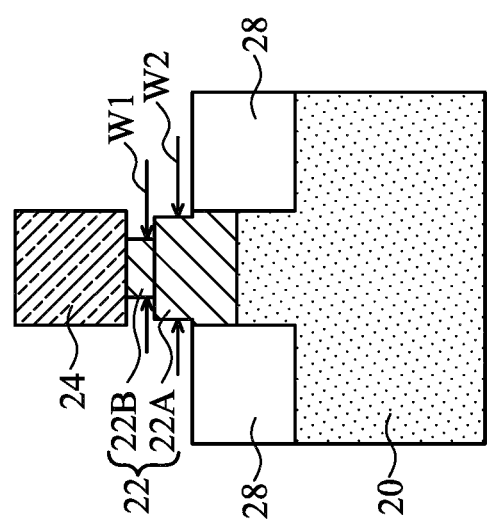
Figure 1I:
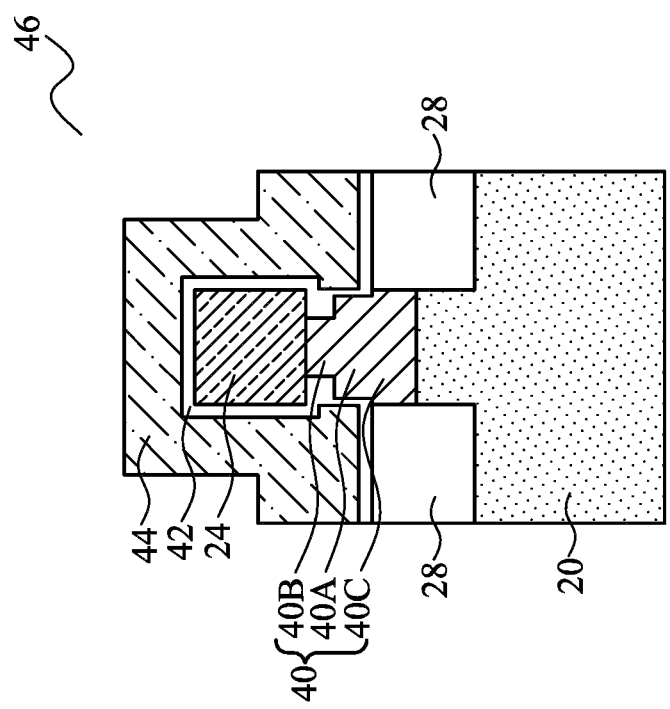

The subsequently illustrated FIGS. 1G through 1I are obtained from the same plane that contains line CW-CW in FIG. 1F. Alternatively stated, the cross-sectional views in FIGS. 1G through 1I are in the channel width direction and cross the channel section of the resulting FinFET. Referring to FIG. 1G, an etching step is performed. In some embodiments, the etchant is selected from HF, HF—$HNO_3$, HF:$H_2O_2$:$CH_3COOH$-based solutions, halogen-gas-based plasmas, gaseous acid vapors such as HCl or HF vapor, and the like. The etching may be isotropic. Since SiGe layer 22B has a higher germanium percentage than SiGe layer 22A, the etching rate of SiGe layer 22B is higher than the etch rate of SiGe layer 22A, as shown in FIG. 5. Accordingly, after the etch step, width W1 of SiGe layer 22B is smaller than width W2 of SiGe layer 22A. In some embodiments, ratio W1/W2 is between about 0.3 and about 0.9. Although FIG. 1G illustrates that the corners of the remaining SiGe layer 22A are sharp corners, they may actually be rounded. In the etching of SiGe layers 22A and 22B, silicon layer 24 is also etched. The etch rate of silicon layer 24, however, is much lower than the etch rate of SiGe layer 22. For example, the etch rate of silicon layer 24 may be about 1/30 of the etch rate of SiGe layer 22. Accordingly, when SiGe layer 22 is etched, the profile of silicon layer 24 is substantially unchanged.

Referring to FIG. 1H, an oxidation is performed, so that SiGe layer 22 is oxidized. Silicon layer 24 is also partially oxidized. However, the oxidation rate of silicon layer 24 is much lower (sometimes 30 times lower) than the oxidation of SiGe layer 22. The resulting oxide on the surface of silicon layer 24 is hence very thin (which may have a thickness smaller than about 10 Å), and is not shown herein. The oxidation may be performed using a furnace oxidation by exposing the respective wafer to oxygen, with an oxidation temperature being between about 500° C. and about 600° C., for example. Alternatively, the oxidation may be a chemical oxide performed at a low temperature (for example, between about 20° C. and 25° C.), using for example, a hydrogen peroxide ($H_2O_2$) solution. Accordingly, silicon germanium oxide ($SiGeO_x$) region 40 is formed, wherein x represents that oxygen in silicon germanium oxide region 40 may vary. In the result structure, $SiGeO_x$ region 40 includes lower portion 40A and upper portion 40B. Upper portion 40B may have a higher germanium percentage than in lower portion 40A. Furthermore, width W1' of upper portion 40B is smaller than width W2' in lower portion 40A. In some embodiments, ratio W1'/W2' may be between about 0.3 and about 0.9. In addition, $SiGeO_x$ region 40 may include portion 40C, which has width W3' greater than width W2', wherein portion 40C is below the top surfaces 28A of STI regions 28.

FIG. 1I illustrates the formation of gate dielectric 42, and gate electrode 44 on gate dielectric 42. The formation of gate dielectric 42 and gate electrode 44 may include forming a blanket gate dielectric layer using a conformal deposition method, forming a blanket gate electrode using a conformal deposition method, and patterning the gate dielectric layer and the blanket gate electrode layer. Gate dielectric 42 may include a thin silicon oxide layer. Gate dielectric 42 may further include a high-k dielectric layer(s) that is formed of a high-k dielectric material such as hafnium oxide, zirconium oxide, or the like. Other oxides and/or nitrides of Hf, Al, La, Lu, Zr, Be, Mg, and/or the like, may also be used in gate dielectric 42. In some embodiments, gate dielectric 42 extends underlying, and contacting, a bottom surface of silicon layer 24, and hence the channel of the respective FinFET extends to the bottom surface of silicon layer 24.

Gate electrode 44 may include Ti, Ta, W, Mo, Ru, Pt, Co, Ni, Pd, Al, or alloys thereof or compound metals such as TiN, TaC, or TaN. FinFET 46 is thus formed, which includes the channels in silicon layer 24, gate dielectric 42, gate electrode 44, and source/drain regions 34 (FIG. 1D-2). The channels of FinFET 46 include the top surface portion, sidewall surface portion, and bottom surface portion of silicon layer 24.

In FIG. 1I, silicon layer 24, which forms the channel of the resulting FinFET, is spaced apart from substrate 20 by $SiGeO_x$ region 40. In the oxidation of SiGe layer 22 for forming $SiGeO_x$ region 40 (FIG. 1H), the volume of $SiGeO_x$ region 40 is swollen over that of SiGe layer 22. Hence, a tensile strain is generated in the respective channel (silicon layer 24). Due to the reduction of the width of upper portion of $SiGeO_x$ region 40, which is caused by the etching of $SiGeO_x$ region 40 (FIG. 1H), the vertical strain for pushing up silicon layer 24 is reduced, while the lateral strain (in the source-drain region) in the channel length direction (in the source-drain direction) remains. Since the vertical strain is undesirable and the lateral strain is desirable, the undesirable strain is reduced without affecting the desirable strain.

Figure 2A:
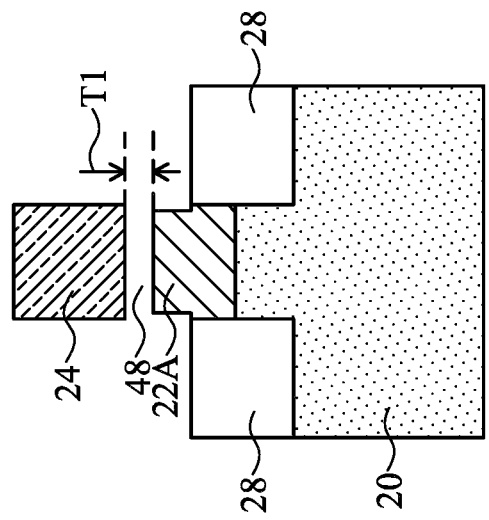

FIGS. 2A through 2C illustrate cross-sectional views of intermediate stages in the formation of a FinFET in accordance with alternative embodiments. These embodiments are similar to the embodiments in FIGS. 1A through 1I, except that the upper portion of SiGe layer is fully removed rather than thinned. Unless specified otherwise, the materials and formation methods of the components in these embodiments are essentially the same as the like components, which are denoted by like reference numerals in the embodiments shown in FIGS. 1A through 1I. The details regarding the formation process and the materials of the components shown in FIGS. 2A through 2C (and FIGS. 3A-3C, 4A, and 4B) may thus be found in the discussion of the embodiment shown in FIGS. 1A through 1I.

The initial steps of these embodiments are essentially the same as shown in FIGS. 1A through 1F. Next, referring to FIG. 2A, an etching step is performed. In some embodiments, the etchant is selected from HF, HF—$HNO_3$, HF:$H_2O_2$: $CH_3COOH$-based solutions, halogen-gas-based plasmas, gaseous acid vapors such as HCl or HF vapor, and the like. The etching may be isotropic. Since SiGe layer 22B has a higher germanium percentage than SiGe layer 22A, the etch rate of SiGe layer 22B is higher than the etch rate of SiGe layer 22A, as shown in FIG. 5. Accordingly, after the etch step, SiGe layer 22B is fully removed, while SiGe layer 22A still has a portion remaining. Although FIG. 2A illustrates that the corners of the remaining SiGe layer 22A are sharp corners, they may actually be rounded.

As a result of the etching, gap 48 is formed to separate silicon layer 24 from SiGe layer 22A. The suspended silicon layer 24 is actually supported by source/drain regions 34 (FIG. 1D-2), and hence will not fall down. In some embodiments, gap 48 has vertical thickness Ti between about 1 nm and about 20 nm, although different values may be used.

Next, referring to FIG. 2B, an oxidation step is performed to oxidize SiGe layer 22A to form $SiGeO_x$ region 40. The oxidation may be performed using essentially the same process as in FIG. 1H, and the details are not repeated herein. Since the volume of $SiGeO_x$ region 40 is increased over that of SiGe layer 22A, after the oxidation, gap 48 in FIG. 2A disappears, and the top surface of $SiGeO_x$ region 40 contacts the bottom surface of silicon layer 24. In the resulting structure, $SiGeO_x$ region 40 may still apply a vertical strain to silicon layer 24 to push up silicon layer 24. It is appreciated that thickness Ti of gap 48 (FIG. 2A) affects the vertical strain, and the greater thickness Ti is, the smaller the vertical strain is. In some embodiments, the SiGeOx may not completely fill gap 48, which will thus remain between SiGeOx layer 40 and channel layer 24.

FIG. 2C illustrates the formation of gate dielectric 42 and gate electrode 44, so that FinFET 46 is formed. The source/drain regions 34 of FinFET 46 are shown in FIG. 1D-2. The details of gate dielectric 42 and gate electrode 44 are essentially the same as in FIG. 1I, and hence are not repeated herein. In these embodiments, due to the formation of the gap between the SiGe layer and the overlying silicon layer, which forms the channel region of the FinFET, the vertical strain is reduced without affecting the horizontal strain.

Figure 3B:
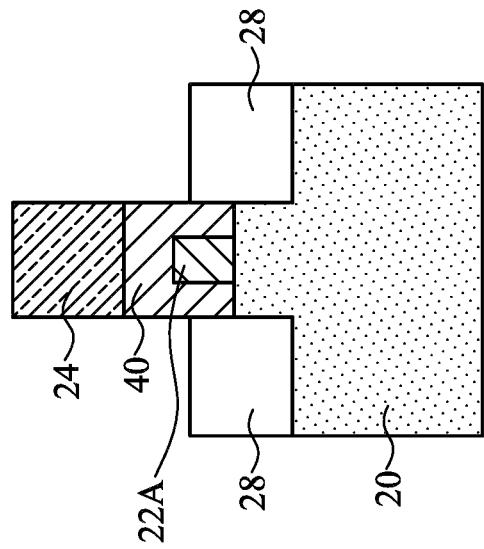
Figure 3A:
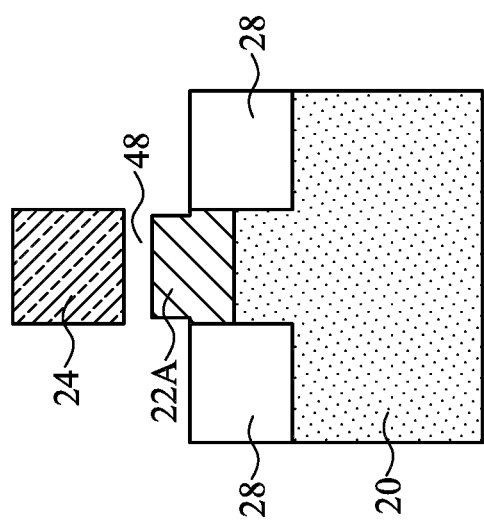

FIGS. 3A through 3C-2 illustrate the formation of a FinFET in accordance with yet alternative embodiments. These embodiments are similar to the embodiments in FIGS. 2A through 2C, except that in the oxidation of the SiGe layer, the outer portion of the SiGe layer is oxidized, while the inner portion of the SiGe layer remains un-oxidized. The initial steps of these embodiments are essentially the same as shown in FIGS. 1A through 1F. Next, referring to FIG. 3A, SiGe layer 22B (FIG. 1C-1) is etched to form gap 48 in FIG. 3A. After the formation of gap 48, SiGe layer 22A is oxidized to form SiGeO$_x$ region 40, as shown in FIG. 3B. The oxidation may be performed using essentially the same process as in FIG. 1H, and the details are not repeated herein. In the oxidation, the process is controlled, so that the outer portions of SiGe layer 22A (FIG. 3A) are oxidized, and the inner portion of SiGe layer 22A remain un-oxidized. As a result, SiGeO$_x$ region 40 includes portions on the opposite sides of the remaining SiGe layer 22A, and a portion over the remaining SiGe layer 22A.

FIG. 3C-1 illustrates the formation of gate dielectric 42 and gate electrode 44, so that FinFET 46 is formed. The source/drain regions 34 of FinFET 46 are the same as in, and are shown in, FIG. 1D-2. The details of gate dielectric 42 and gate electrode 44 are essentially the same as in FIG. 1I, and hence are not repeated herein. Again, in these embodiments, due to the formation of the gap between SiGe layer and the overlying silicon layer 24, which forms the channel region of the FinFET, the vertical strain is reduced without affecting the horizontal strain.

FIG. 3C-2 illustrates a cross-sectional view of FinFET 46, wherein the cross-sectional view is obtained from the plane containing line 3C-2-3C-2 in FIG. 3C-1. It is shown that remaining SiGe layer 22A and SiGeO$_x$ region 40 extend from the semiconductor material on the source side to the semiconductor material on the drain side. Accordingly, the remaining SiGe layer 22A and SiGeO$_x$ region 40 may physically interconnect source and drain regions 34.

Figures 4A, 4B:
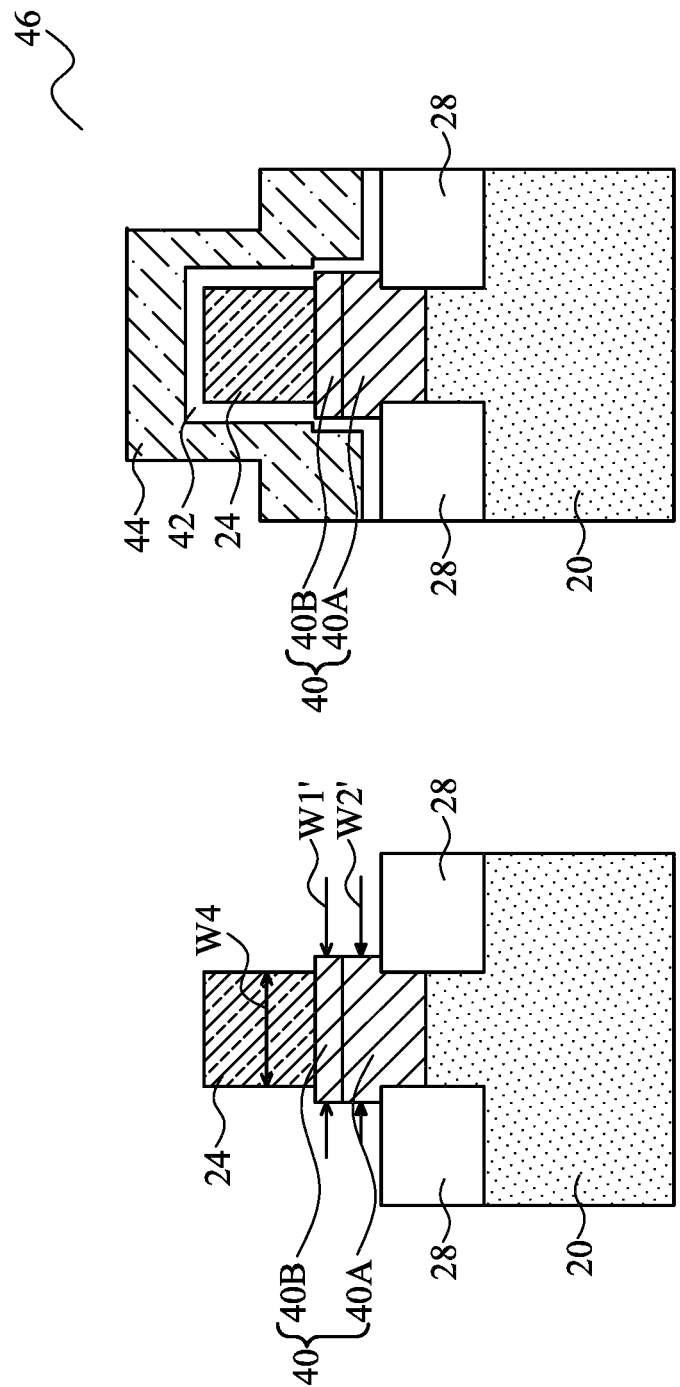
FIGS. 4A and 4B illustrate cross-sectional views of intermediate stages in the manufacturing of a FinFET in accordance with yet alternative exemplary embodiments.

FIGS. 4A and 4B illustrate the formation of a FinFET in accordance with yet alternative embodiments. These embodiments are similar to the embodiments in FIGS. 1A through 1I, except that SiGe layer is not etched before the oxidation, and an anneal is performed to absorb the vertical strain. The initial steps of these embodiments are essentially the same as shown in FIGS. 1A through 1F. Next, referring to FIG. 4A, SiGe layers 22A and 22B (FIG. 1C-1) are oxidized to form SiGeO$_x$ region 40. SiGe layer 22A, after being oxidized, forms SiGeO$_x$ region 40A. SiGe layer 22B, after being oxidized, forms SiGeO$_x$ region 40B. Since SiGe layer 22B has a higher germanium percentage than SiGe layer 22A, SiGeO$_x$ region 40B has a higher germanium percentage than SiGeO$_x$ region 40B. The oxidation may be performed using essentially the same process as in FIG. 1H, and the details are not repeated herein. As a result of the oxidation, width W1' of SiGeO$_x$ region 40B and W2' of SiGeO$_x$ region 40A are greater than width W4 of silicon layer 24, which is oxidized at a much smaller rate that SiGe layer 22. The resulting thin oxide layer on the surface of silicon layer 24 is not shown.

After the oxidation, an anneal is performed. The anneal is performed at an elevated temperature in an oxygen-free environment. In some embodiments, the anneal is performed at a temperature between about 450° C. and about 1,100° C. Silicon germanium oxide may have a softening temperature higher than 450° C. The softening temperature of a region is the temperature that when the respective region is annealed at this temperature, the silicon germanium oxide region starts to be softened, and partially liquidized. If the region is annealed at temperatures below the respective softening temperature, the region is not softened. Germanium oxide has a softening temperature higher than about 450° C., silicon oxide has a softening temperature higher than 1,100° C., and silicon germanium oxide has a softening temperature between about 450° C. and about 1,100° C. The silicon germanium oxides with higher germanium percentages have lower softening temperatures than the silicon germanium oxide with lower germanium percentages. Therefore, by selecting anneal temperature to be between about 450° C. and about 1,100° C., SiGeO$_x$ region 40 is softened. In addition, the anneal temperature is selected so that the softening of SiGeO$_x$ region 40B is significantly greater than that of SiGeO$_x$ region 40A. It is realized that the softening temperature of silicon germanium oxide is related to the germanium percentage, as shown in FIG. 5. Therefore, the anneal temperature is at least higher than the softening temperature of SiGeO$_x$ region 40B, and may be lower than (although it may also be equal to or higher than), the softening temperature of SiGeO$_x$ region 40A. Table 1 illustrates the brief softening temperature of SiGeO$_x$ regions, wherein the desirable anneal temperature may be found referring to Table 1 and the germanium percentage of SiGeO$_x$ region 40B.

TABLE 1

| Germanium Percentage | Softening temperature |
| --- | --- |
| 0 percent to 20 percent | 1,000° C.~1,100° C. |
| 20 percent to 40 percent | 800° C.~1,000° C. |
| 40 percent to 60 percent | 700° C.~800° C. |
| 60 percent to 80 percent | 500° C.~700° C. |
| 80 percent to 100 percent | 450° C.~500° C. |

The anneal step may be performed for a period of time between about 10 seconds and about 30 minutes. As a result of the anneal, since SiGeO$_x$ region 40B is softened, the vertical strain for pushing silicon layer 24 up is absorbed, while the lateral strain is not significantly affected.

FIG. 4B illustrates the formation of gate dielectric 42 and gate electrode 44, so that FinFET 46 is formed.

In the embodiments of the present disclosure, by forming a gradient SiGe layer, and performing thinning, annealing, or the like on the SiGe layer or the respective silicon germanium oxide regions, the vertical strain may be significantly reduced. Simulation results revealed that by using the embodiments, the undesirable vertical strain may be reduced from 5E9 Pa to about 2E9 Pa, and to as low as 0.5E9 Pa in some embodiments. In the meantime, the desirable horizontal strain may remain substantially unchanged.

In accordance with some embodiments, a FinFET includes a semiconductor layer over a substrate, wherein the semiconductor layer forms a channel of the FinFET. A first silicon germanium oxide layer is over the substrate, wherein the first silicon germanium oxide layer has a first germanium percentage. A second silicon germanium oxide layer is over the first silicon germanium oxide layer. The second silicon germanium oxide layer has a second germanium percentage greater than the first germanium percentage. A gate dielectric is on sidewalls and a top surface of the semiconductor layer. A gate electrode is over the gate dielectric.

In accordance with other embodiments, a device includes a FinFET, which includes a first silicon germanium oxide layer over a substrate. The first silicon germanium oxide layer has a first germanium percentage, wherein the first silicon germanium oxide layer has a first width. A second silicon germanium oxide layer is over the first silicon germanium oxide layer, wherein the second silicon germanium oxide layer has a second germanium percentage greater than the first germanium percentage. The second silicon germanium oxide layer has a second width smaller than the first width, with the first width and the second width being measured in a channel width direction of the FinFET. A silicon layer is over the second silicon germanium oxide layer, wherein the silicon layer forms a channel of the FinFET. A gate dielectric is on sidewalls and a top surface of the semiconductor layer. A gate electrode is over the gate dielectric.

In accordance with yet other embodiments, a method includes performing a first epitaxy to form a first silicon germanium layer over a substrate, performing a second epitaxy to form a second silicon germanium layer over the first silicon germanium layer, and performing a third epitaxy to form a silicon layer substantially free from germanium over the second silicon germanium layer. The first silicon germanium layer is oxidized to form a first silicon germanium oxide layer. A gate dielectric is formed on a top surface and sidewalls of the silicon layer, wherein the gate dielectric extends on sidewalls of the first silicon germanium oxide layer. A gate electrode is formed over the gate dielectric.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a first epitaxy to form a first silicon germanium layer over a substrate;
    performing a second epitaxy to form a second silicon germanium layer over the first silicon germanium layer;
    performing a third epitaxy to form a silicon layer substantially free from germanium over the second silicon germanium layer;
    etching the first silicon germanium layer and the second silicon germanium layer, wherein after the etching, the second silicon germanium layer has edges recessed from respective edges of the first silicon germanium layer
    after the etching, oxidizing the first silicon germanium layer to form a first silicon germanium oxide layer;
    forming a gate dielectric on a top surface and sidewalls of the silicon layer, wherein the gate dielectric extends on sidewalls of the first silicon germanium oxide layer; and
    forming a gate electrode over the gate dielectric.

2. The method of claim 1 wherein after the etching, a remaining portion of the second silicon germanium layer is narrower than a remaining portion of the first silicon germanium layer.

3. The method of claim 1, wherein during the oxidizing, a second silicon germanium oxide layer is generated from oxidized second silicon germanium layer, and wherein the method further comprises:
    after the oxidizing, performing an annealing at an anneal temperature, wherein the anneal temperature is higher than a softening temperature of the second silicon germanium oxide layer, and lower than a softening temperature of silicon oxide.

4. The method of claim 1 further comprising:
    forming a dummy gate over the silicon layer, wherein the dummy gate extends on sidewalls of the first silicon germanium layer, the second silicon germanium layer, and the silicon layer;
    forming an Inter-Layer Dielectric (ILD) on opposite sides of the dummy gate; and
    removing the dummy gate, wherein the oxidizing is performed through a recess left by the dummy gate.

5. The method of claim 1, wherein the second silicon germanium layer has a higher germanium percentage than the first silicon germanium layer.

6. The method of claim 1, wherein an inner portion of the first silicon germanium layer remains after the oxidation.

7. The method of claim 1, wherein an entirety of the first silicon germanium layer is oxidized by the oxidation.

8. The method of claim 1 further comprising forming a Shallow Trench Isolation (STI) region, wherein a lower portion of the first silicon germanium layer being lower than a top surface of the STI region, and an upper portion of the first silicon germanium layer is higher than the top surface of the STI region.

9. A method comprising:
    patterning a stacked layer to form a stacked semiconductor strip comprising:
        a first silicon germanium layer over a substrate;
        a second silicon germanium layer over the first silicon germanium layer, with the second silicon germanium layer having a higher germanium percentage than the first silicon germanium layer; and
        a silicon layer substantially free from germanium over the second silicon germanium layer;
    forming a dummy gate on a top surface and sidewalls of a middle portion of the stacked semiconductor strip;
    forming an Inter-Layer Dielectric (ILD) on opposite sides of the dummy gate;
    removing the dummy gate to form a recess in the ILD, with the silicon layer, the second silicon germanium layer, and the first silicon germanium layer exposed through the recess; and
    performing an oxidation to oxidize at least outer portions of the first silicon germanium layer.

10. The method of claim 9, wherein the oxidation is performed through the recess.

11. The method of claim 9 further comprising:
    after the oxidation, forming a gate dielectric on a top surface and sidewalls of the silicon layer; and
    forming a gate electrode over the gate dielectric.

12. The method of claim 9 further comprising, before the oxidation, etching the first silicon germanium layer and the second silicon germanium layer through the recess, with at least a portion of the first silicon germanium layer left after the etching.

13. The method of claim 12, wherein after the etching the first silicon germanium layer and the second silicon germanium layer, an entirety of the second silicon germanium layer is removed.

14. The method of claim 13, wherein during the oxidation, a gap left by the etched second silicon germanium layer is fully filled by a silicon germanium oxide generated from the first silicon germanium layer.

15. The method of claim 12, wherein after the etching the first silicon germanium layer and the second silicon germanium layer, the second silicon germanium layer is partially removed.

16. The method of claim 9, wherein an entirety of the first silicon germanium layer in the stacked semiconductor strip is oxidized in the oxidation.

17. The method of claim 9, wherein an inner portion of the first silicon germanium layer is not oxidized by the oxidation.

18. A method comprising:
  performing a first epitaxy to form a first silicon germanium layer over a substrate;
  performing a second epitaxy to form a second silicon germanium layer over the first silicon germanium layer, with the second silicon germanium layer having a higher germanium percentage than the first silicon germanium layer;
  performing a third epitaxy to form a silicon layer substantially free from germanium over the second silicon germanium layer;
  etching the first silicon germanium layer and the second silicon germanium layer, wherein the second silicon germanium layer is etched partially, and wherein after the etching, the second silicon germanium layer is narrower than the first silicon germanium layer;
  performing an oxidation to oxidize the first silicon germanium layer and the second silicon germanium layer to generate a silicon germanium oxide region;
  forming a gate dielectric on a top surface and sidewalls of the silicon layer, wherein the gate dielectric extends on sidewalls of the silicon germanium oxide region; and
  forming a gate electrode over the gate dielectric.

19. The method of claim 18 further comprising:
  forming a dummy gate on a top surface of the silicon layer, wherein the dummy gate extends on sidewalls of the silicon layer, the first silicon germanium layer, and the second silicon germanium layer;
  forming an Inter-Layer Dielectric (ILD) on opposite sides of the dummy gate; and
  removing the dummy gate to form a recess in the ILD, with the silicon layer, the second silicon germanium layer, and the first silicon germanium layer exposed through the recess, wherein the oxidation is performed through the recess.

20. The method of claim 18, wherein the first silicon germanium layer and the second silicon germanium layer are fully oxidized.

* * * * *